(12) United States Patent
Ankamreddi et al.

(10) Patent No.: US 11,892,864 B2
(45) Date of Patent: Feb. 6, 2024

(54) VOLTAGE SUPERVISOR WITH LOW QUIESCENT CURRENT

(71) Applicant: TEXAS INSTRUMENTS INCORPORATED, Dallas, TX (US)

(72) Inventors: Ramakrishna Ankamreddi, Bengaluru (IN); Rohit Phogat, Bengaluru (IN); Siddhant Rohela, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 140 days.

(21) Appl. No.: 17/148,196

(22) Filed: Jan. 13, 2021

(65) Prior Publication Data
US 2021/0216094 A1   Jul. 15, 2021

(30) Foreign Application Priority Data

Jan. 14, 2020   (IN) .............................. 202041001565

(51) Int. Cl.
| | |
|---|---|
| *G06F 1/28* | (2006.01) |
| *G05F 3/26* | (2006.01) |
| *H03K 17/30* | (2006.01) |
| *G01R 19/165* | (2006.01) |
| *G05F 3/24* | (2006.01) |

(52) U.S. Cl.
CPC ....... *G05F 3/262* (2013.01); *G01R 19/16533* (2013.01); *G01R 19/16566* (2013.01); *G05F 3/247* (2013.01); *G06F 1/28* (2013.01); *H03K 17/302* (2013.01)

(58) Field of Classification Search
CPC ............ G06F 1/28; G05F 3/247; G05F 3/262; H03K 17/30; G01R 19/16566; G01R 19/16533
See application file for complete search history.

(56) References Cited

U.S. PATENT DOCUMENTS

| | | |
|---|---|---|
| 5,180,929 A | 1/1993 | KoKubun |
| 2003/0102855 A1 | 6/2003 | Kim |

(Continued)

OTHER PUBLICATIONS

Search Report for PCT Patent Application No. PCT/US2021/013427, date of mailing of the international search report dated Apr. 15, 2021, 1 page.

(Continued)

*Primary Examiner* — Harry R Behm

(74) *Attorney, Agent, or Firm* — Charles F. Koch; Frank D. Cimino

(57) ABSTRACT

A voltage supervisor includes a first transistor coupled between a first supply voltage and a second supply voltage. The voltage supervisor includes a second transistor coupled between the first supply voltage and the second supply voltage. The voltage supervisor is configured to provide a first current proportional to a difference in gate-to-source voltages of the first transistor and the second transistor. The voltage supervisor is also configured to provide a second current proportional to a difference in the first supply voltage and the difference in gate-to-source voltages of the first transistor and the second transistor. The voltage supervisor is configured to compare the first current to the second current to determine a voltage value that changes a state responsive to the first supply voltage crossing a threshold.

13 Claims, 3 Drawing Sheets

(56) References Cited

U.S. PATENT DOCUMENTS

2011/0095789 A1* 4/2011 Tang ................ G01R 19/16538
327/72
2014/0184184 A1 7/2014 Yajima et al.
2019/0360448 A1 11/2019 Kita et al.
2020/0371541 A1* 11/2020 Fort .................... H03K 17/223

OTHER PUBLICATIONS

Extended European Search Report dated Jul. 17, 2023, U.S. Appl. No. 21/741,872, 8 pages.

* cited by examiner

VOLTAGE SUPERVISOR WITH LOW QUIESCENT CURRENT

CROSS-REFERENCE TO RELATED APPLICATIONS

The present application claims priority to Indian Provisional Patent Application No. 202041001565, which was filed Jan. 14, 2020, is titled "MOSFET $V_{TH}$ GAP BASED, TRIP-POINT SCALABLE SUPERVISOR CIRCUIT WITH QUIESCENT CURRENT REGULATION," and is hereby incorporated herein by reference in its entirety.

BACKGROUND

Voltage supervisors are useful in many applications to monitor a power supply voltage and detect certain issues with the power supply voltage. In some applications, voltage supervisors can detect if the power supply voltage falls below a threshold or rises above a threshold. Responsive to the voltage crossing a threshold, the voltage supervisor asserts a signal. That signal is useful for taking an action to ensure proper power supply operation.

SUMMARY

In accordance with at least one example of the description, a voltage supervisor includes a first transistor coupled between a first supply voltage and a second supply voltage. The voltage supervisor includes a second transistor coupled between the first supply voltage and the second supply voltage. The voltage supervisor is configured to provide a first current proportional to a difference in gate-to-source voltages of the first transistor and the second transistor. The voltage supervisor is also configured to provide a second current proportional to a difference in the first supply voltage and the difference in gate-to-source voltages of the first transistor and the second transistor. The voltage supervisor is configured to compare the first current to the second current to determine a voltage value that changes a state responsive to the first supply voltage crossing a threshold.

In accordance with at least one example of the description, a system includes a reference current generator including a current mirror, a first transistor, a second transistor, and a first resistor, where a control terminal of the first transistor is coupled to a control terminal of the second transistor, and a first current terminal of the second transistor is coupled to the first resistor. The system includes a third transistor having a control terminal coupled to the current mirror, a first current terminal adapted to be coupled to a power supply, and a second current terminal coupled to a second resistor. The system includes a fourth transistor having a control terminal coupled to the control terminal of the third transistor, and a first current terminal adapted to be coupled to the power supply. The system includes a fifth transistor having a second current terminal coupled to the second current terminal of the fourth transistor, a control terminal coupled to the control terminal of the second transistor, and a first current terminal coupled to a sixth transistor.

In accordance with at least one example of the description, a voltage supervisor includes a reference current generator having a current mirror, the current mirror configured to provide a first current that is proportional to a difference in gate-to-source voltages of a first transistor and a second transistor. The voltage supervisor includes a third transistor having a gate coupled to the current mirror, a source adapted to be coupled to a power supply, and a drain coupled to a resistor, the third transistor is configured to provide a second current proportional to a difference in a supply voltage and the difference in gate-to-source voltages of the first transistor and the second transistor. The voltage supervisor includes a fourth transistor having a gate coupled to the gate of the third transistor, a source adapted to be coupled to the power supply, and a drain having a drain voltage indicative of the supply voltage above a threshold.

DETAILED DESCRIPTION

Voltage supervisors are useful to monitor a power supply voltage and assert a signal if a threshold is reached. A node (called a trip node) has a voltage that flips from a high voltage to a low voltage or vice versa when the power supply voltage reaches a threshold. This voltage of the power supply that flips the trip node is called the trip voltage (e.g., the threshold voltage or voltage threshold). Conventional voltage supervisors have numerous disadvantages. For example, conventional voltage supervisors often have high off-stage currents, also referred to as quiescent current ($I_Q$), and have a slow response time. Also, small threshold voltages (the threshold voltages of the power supply that are being monitored) are often difficult to realize in conventional voltage supervisors. Further, achieving a programmable threshold voltage of the power supply that is being supervised is difficult in conventional voltage supervisors. For example, if the supply voltage that is being supervised is changed to a different voltage, the voltage supervisor is usually redesigned to handle the new supply voltage. Further still, conventional voltage supervisors often take up a large silicon area.

In examples herein, a voltage supervisor provides a low $I_Q$, has a quick response time, can be scaled for a range of threshold voltages, and has a small silicon area. The voltage supervisor described herein uses a circuit topology with four branches, where two different currents flow through the branches. The first current is directly proportional to a difference in gate-to-source voltages ($\Delta V_{GS}$) of two field effect transistors (FETS). The first current is useful as a reference current, as this current does not vary with the supply voltage. The second current is directly proportional to the supply voltage, and therefore the magnitude of the second current is indicative of the magnitude of the supply voltage. These two currents are compared to determine the state of a trip node. Responsive to the supply voltage exceeding a threshold, the trip node flips from a low voltage to a high voltage because the second current overpowers the first current. Responsive to the trip node flipping, the circuit is clamped to reduce an increase in $I_Q$.

Figure 1:
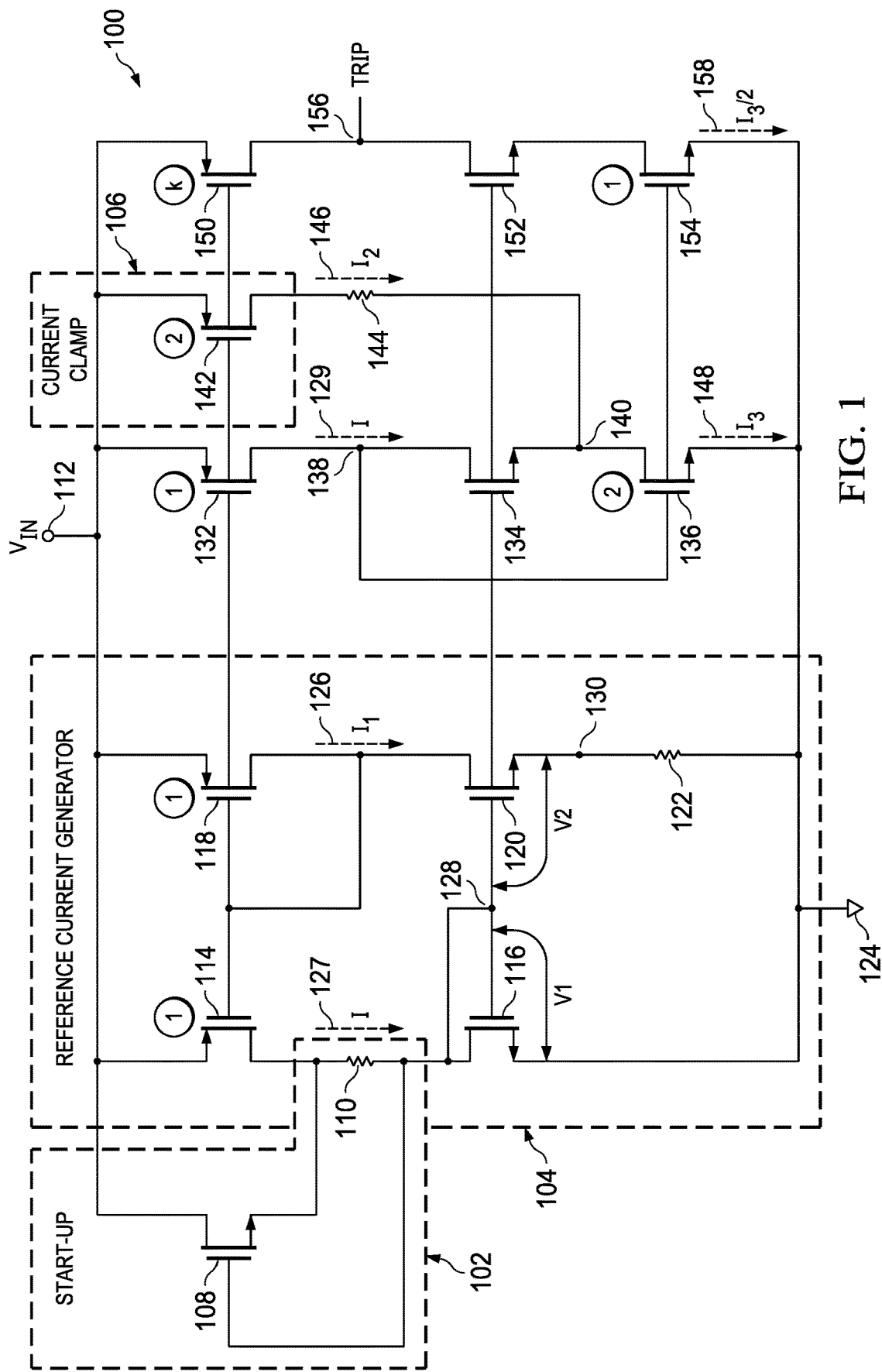
FIG. 1 is a voltage supervisor in accordance with various examples.

FIG. 1 is a voltage supervisor 100 in accordance with various examples herein. Voltage supervisor 100 includes a start-up section 102, a reference current generator 104, and a current clamp 106. Voltage supervisor 100 can also be described as having four vertical branches, which are described in operation below. Start-up section 102 includes transistor 108 and resistor 110. Transistor 108 is an n-type FET in one example. Transistor 108 is a native transistor in one example, with a threshold voltage ($V_{TH}$) of approximately −100 mV. A native transistor with a different low or slightly negative $V_{TH}$ may be used in other examples. A native transistor is a variety of FET that is intermediate between enhancement and depletion modes. In other examples, a different type of transistor may be useful. By using transistors with relatively low threshold voltages $V_{TH}$, voltage supervisor 100 can monitor lower supply voltage levels. If the threshold voltages $V_{TH}$ of the transistors were relatively higher, the transistors in voltage supervisor 100 would be unable to operate at low enough voltage levels to sufficiently monitor a lower supply voltage. The source of transistor 108 is coupled to a first terminal of resistor 110 and a drain coupled to node 112. A supply voltage $V_{IN}$ is provided at node 112 in an example. A gate of transistor 108 is coupled to a second terminal of resistor 110. In examples herein, a gate of a transistor may also be referred to as a control terminal. The source or the drain of a transistor may also be referred to as current terminals. Start-up section 102 is useful for starting voltage supervisor 100 in an example. Responsive to starting voltage supervisor 100, start-up section 102 becomes inactive. The operation of start-up section 102 is described below.

Voltage supervisor 100 includes a reference current generator 104. Reference current generator 104 has two vertical branches in this example. In other examples, a different type of reference current generator is useful to provide a reference current. A first branch of reference current generator 104 includes transistor 114, resistor 110, and transistor 116. A second branch of reference current generator 104 includes transistor 118, transistor 120, and resistor 122. In an example, reference current generator operates to provide a current $I_1$ (described below) that is used by voltage supervisor 100 as a reference to determine if a supply voltage has exceeded a predetermined threshold.

Transistor 114 is a p-type FET in one example. In one example, transistor 114 is a low threshold voltage transistor with a threshold voltage $V_{TH}$ of approximately 400-500 mV. In other examples, a different type of transistor may be useful. Transistor 114 has a source coupled to node 112 and a drain coupled to the first terminal of resistor 110. Transistor 114 also has a gate coupled to the gate of transistor 118. Transistor 116 is an n-type FET in one example. Transistor 116 has a drain coupled to the second terminal of resistor 110. The drain of transistor 116 is also coupled to the gate of transistor 116. Transistor 116 has a source coupled to ground 124. In other examples, the rail at ground 124 could be coupled to a voltage rail other than ground 124 that is at a different voltage (a second supply voltage) than the first supply voltage $V_{IN}$ provided at node 112.

In the second branch of reference current generator 104, transistor 118 has a source coupled to node 112 and a drain coupled to the gate of transistor 118. The drain of transistor 118 is also coupled to a drain of transistor 120. Transistor 118 is a p-type FET in one example. Transistor 120 has a gate coupled to the gate of transistor 116. Transistor 120 also has a source coupled to a first terminal of resistor 122. Transistor 120 is an n-type FET in one example. A second terminal of resistor 122 is coupled to ground 124.

In one example, transistor 118 is a low threshold voltage transistor with a threshold voltage $V_{TH}$ of approximately 400-500 mV. In other examples, a different type of transistor may be useful. Transistors 114 and 118 have a "1" in a circle next to them. This "1" indicates that transistors 114 and 118 are similar size, and, since transistors 114 and 118 are configured as a current mirror, the current through transistor 114 will be approximately equal to the current flowing through transistor 118. Since the gates of transistors 114 and 118 are connected and the sources are connected, the gate-to-source voltages $V_{GS}$ of transistors 114 and 118 are the same. In one example operation, current I 127 flows through transistor 114, and current $I_1$ 126 flows through transistor 118. Currents $I_1$ 126 and I 127 are approximately equal in an example. Current $I_1$ 126 and its usage in voltage supervisor 100 is described below.

In an example, transistor 116 is a low threshold voltage transistor with a threshold voltage $V_{TH}$ of approximately 400-500 mV. In an example, transistor 120 is a native transistor, with a threshold voltage $V_{TH}$ of approximately −100 mV. In other examples, a different type of transistor may be useful.

Start-up section 102 operates as follows. Initially, when the supply voltage $V_{IN}$ at node 112 is low (for example, below two volts) and the currents have not developed yet in voltage supervisor 100, node 128 is at ground (0 V). Also, the first terminal of resistor 110 is at ground, because no current I 127 is flowing through resistor 110. In turn, the $V_{GS}$ of transistor 108 is 0 V, which is sufficient for transistor 108 to turn on and begin conducting current. The current conducted by transistor 108 acts as a start-up current and charges the parasitic capacitance at node 128, thereby increasing the voltage potential at node 128 and turning on transistor 116. Turning on transistor 116 causes other devices (transistors 114, 118, and 120) to begin conducting current in their respective current mirror arrangements, and the conducted currents increase until a steady state is achieved. The positive feedback in the two leftmost branches of voltage supervisor 100 aid in reaching the steady state. Start-up section 102 ensures voltage supervisor 100 does not have zero current and remain inoperable in an example.

After current I 127 begins flowing through transistor 114, the voltage drop across resistor 110 increases, which makes the voltage at the source of transistor 108 sufficiently higher than the voltage at the gate of transistor 108 so as to turn transistor 108 off. This is because the voltage drop across resistor 110 equals the $-V_{GS}$ of transistor 108. Resistor 110 is sized such that the voltage drop across resistor 110 is large enough to keep transistor 108 off during normal operation of voltage supervisor 100.

The first two branches in voltage supervisor 100 provide a reference current $I_1$ 126 that does not vary with variations in the supply voltage $V_{IN}$. The $V_{GS}$ of transistor 116 is represented by $V_1$, which is the voltage between node 128, coupled to the gate of transistor 116, and common potential (in some examples, ground) 124. A $V_{GS}$ of transistor 120 is represented by $V_2$. $V_2$ is the voltage between node 128 and node 130. The difference between $V_1$ and $V_2$ is equal to the voltage across resistor 122, which is also the voltage at node 130. The voltage at node 130 is therefore referred to as $\Delta V_{GS}$, because it is the difference in the gate-to-source voltages $V_{GS}$ of transistors 116 and 120.

Current $I_1$ 126 flows through transistor 120 and resistor 122 ($R_{BOT}$). Because the voltage across resistor 122 is known, current $I_1$ 126 is calculated in Equation (1):

$$I_1 = \frac{\Delta V_{GS}}{R_{BOT}} \quad (1)$$

As seen in Equation 1, current $I_1$ 126 does not vary with supply voltage $V_{IN}$. The value of current $I_1$ 126 is determined by the difference between the two gate-to-source voltages $V_{GS}$ of transistors 116 and 120, and by the value of resistor 122. As supply voltage $V_{IN}$ varies, the difference between these two $V_{GS}$ values remains the same. As one $V_{GS}$ value rises, so does the other by a similar amount. As one $V_{GS}$ value falls, so does the other by a similar amount. Current $I_1$ 126 is proportional to this $\Delta V_{GS}$ value, and this $\Delta V_{GS}$ value does not vary with supply voltage $V_{IN}$. Therefore, current $I_1$ 126 also does not vary with supply voltage $V_{IN}$. Because of this, current $I_1$ 126 is useful as a reference current to help determine whether supply voltage $V_{IN}$ has risen above a threshold.

A third branch of voltage supervisor 100 includes transistors 132, 134, and 136. Transistor 132 is a p-type FET in one example. In one example, transistor 132 is a low threshold voltage transistor with a threshold voltage $V_{TH}$ of approximately 400-500 mV. In other examples, a different type of transistor may be useful. Transistor 132 can be approximately identical to transistors 114 and 118 in an example. Transistor 132 has a "1" in a circle next to it, which indicates that transistor 132 is approximately the same size as transistors 114 and 118 and capable of conducting a similar amount of current as transistors 114 and 118 (due to transistor 132 also being part of the current mirror formed with transistors 114 and 118). Transistor 132 has a gate coupled to the gate of transistor 118 and a source coupled to node 112. A drain of transistor 132 is coupled to node 138 and a drain of transistor 134. Since transistor 132 forms part of the current mirror with transistors 114 and 118, the current I 129 that flows through transistor 132 is approximately equal to current $I_1$ 126 that flows through transistor 118.

Transistor 134 is an n-type (FET) native transistor in an example, with a threshold voltage $V_{TH}$ of approximately $-100$ mV. In other examples, a different type of transistor may be useful. Transistor 134 has a drain coupled to the drain of transistor 132 at node 138. Transistor 134 has a gate coupled to the gate of transistor 120. Transistor 134 also has a source coupled to node 140 and to the drain of transistor 136. In an example, transistor 134 is an identical transistor to transistor 120.

Transistor 136 has a drain coupled to the source of transistor 134 and a source coupled to ground 124. Transistor 136 also has a gate coupled to node 138, which is coupled to the drain of transistor 134.

The third branch of voltage supervisor 100 includes a side branch, which has a current clamp 106 that includes a transistor 142. The side branch also includes a resistor 144. Transistor 142 has a gate coupled to the gate of transistor 132 and a source coupled to node 112. A drain of transistor 142 is coupled to a first terminal of resistor 144. A second terminal of resistor 144 is coupled to node 140.

In an example, transistor 142 is a low threshold voltage transistor with a threshold voltage $V_{TH}$ of approximately 400-500 mV. In other examples, a different type of transistor may be useful. Transistor 142 has a "2" in a circle next to it, which indicates that transistor 142 is approximately twice the size of transistors 114, 118, and 132, and therefore capable of conducting approximately twice as much current as those three transistors. Transistor 142 also is configured to act as a current mirror with the transistors 114, 118, and 132 when the voltage at node 112 is an adequate amount above the trip point.

A current $I_2$ 146 flows through resistor 144. Current $I_2$ 146 is a current that varies with supply voltage $V_{IN}$ at node 112 (as shown in Equation 2 below), and is useful for determining if the supply voltage $V_{IN}$ has crossed above a threshold. In an example, $V_{IN}$ slowly rises and approaches a threshold voltage. Current $I_2$ 146 flows through transistor 142. A gate-to-source voltage $V_{GS}$ across transistor 134 is $V_2$, which is the voltage between nodes 128 and 130 as described above. In an example, transistors 120 and 134 are identical devices, and their gates are connected, so the gates of transistors 120 and 134 are at the same voltage. A current flowing through transistor 120 is current $I_1$ 126, and a current flowing through transistor 134 is current I 129, which is similar to $I_1$ 126 (due to the current mirror). Because the current through transistors 120 and 134 is the same, and the gates of transistors 120 and 134 are at the same voltage, the sources of transistors 120 and 134 will also be at the same voltage. The voltage at the source of transistor 120 is the voltage at node 130. As described above, that voltage is $\Delta V_{GS}$. Therefore, the voltage at node 140 is also $\Delta V_{GS}$.

Transistor 136 is at the bottom of the third branch of voltage supervisor 100. At the drain of transistor 136 (e.g., node 140), current I 129 is combined with current $I_2$ 146, to create current $I_3$ 148 flowing through transistor 136. The current through resistor 144 is current $I_2$ 146, and the voltage at the second terminal of resistor 144 is $\Delta V_{GS}$. Thus, the voltage at the first terminal of resistor 144 is useful to determine the voltage drop across resistor 144 and determine the value of current $I_2$ 146.

Responsive to supply voltage $V_{IN}$ being lower than the threshold voltage that trips the trip node, the voltage at the first terminal of resistor 144 is approximately $V_{IN}$ with a slight error. This is because transistor 142 is turned on and the voltage drop across it is negligible. Transistor 142 is approximately twice the size of transistors 114, 118, and 132, and is part of the current mirror formed by these transistors. Therefore, transistor 142 has the capacity to conduct approximately twice the current $I_1$ 126. However, transistor 142 is sized so that the voltage difference between supply voltage $V_{IN}$ and ground 124 is not large enough to produce that much current to flow through transistor 142. The voltage at the drain of transistor 142 is close to the voltage at the source of transistor 142 as described above, which means transistor 142 does not conduct the full amount of current it is capable of conducting. Therefore, the current $I_2$ 146 through transistor 142 is less than twice the current $I_1$ 126 in this example. Until $V_{IN}$ reaches the voltage threshold that trips the trip node, the drain voltage of transistor 142 is close to the source voltage of transistor 142, and that source voltage is at supply voltage $V_{IN}$. Therefore, the voltage at the drain of transistor 142 is also close to supply voltage $V_{IN}$. Thus, the voltage at the first terminal of resistor 144 ($R_{TOP}$) is close to supply voltage $V_{IN}$. Equation (2) indicates the value of current $I_2$ 146:

$$I_2 = \frac{V_{IN} - \Delta V_{GS}}{R_{TOP}} \quad (2)$$

During the operating conditions described above, where $V_{IN}$ is below the voltage threshold that trips the trip node, current $I_2$ 146 varies directly with the value of supply voltage $V_{IN}$, instead of being twice the value of $I_1$ 126.

The currents flowing through each of the first three branches of voltage supervisor 100 are described above. The fourth branch of voltage supervisor 100 includes transistors 150, 152, 154 and TRIP node 156. In an example, transistor 150 is a low threshold voltage transistor with a threshold voltage $V_{TH}$ of approximately 400-500 mV. In other examples, a different type of transistor may be useful. Transistor 150 has a "k" in a circle next to it, which indicates that transistor 150 is approximately "k" times the size of transistors 114, 118, and 132, and therefore capable of conducting approximately "k" times as much current as those transistors since it is part of the current mirror formed by those transistors. The source of transistor 150 is coupled to node 112. The gate of transistor 150 is coupled to the gate of transistor 142. The drain of transistor 150 is coupled to TRIP node 156 and to the drain of transistor 152.

Transistor 152 is an n-type (FET) native transistor in an example, with a threshold voltage $V_{TH}$ of approximately −100 mV. In other examples, a different type of transistor may be useful. Transistor 152 has a gate coupled to the gate of transistor 134 and a source coupled to the drain of transistor 154. In an example, transistor 152 is identical to transistors 120 and 134.

Transistor 154 is a standard threshold voltage transistor with a threshold voltage $V_{TH}$ of approximately 700 mV in an example. In other examples, a different type of transistor may be useful. Transistor 154 has a source coupled to ground 124 and a gate coupled to the gate of transistor 136. In one example, transistor 136 is also a standard voltage threshold transistor with a threshold voltage $V_{TH}$ of approximately 700 mV. Transistor 154 has a "1" in a circle next to it, while transistor 136 has a "2" in a circle next to it. These numbers indicate that transistor 136 is approximately twice the size of transistor 154 in this example.

As described above, currents I 129 (approximately equal to $I_1$ 126) and $I_2$ 146 combine to create current $I_3$ 148, which is shown in Equation (3):

$$I_1+I_2=I_3 \tag{3}$$

The current flowing through transistor 136 is current $I_3$ 148, and transistor 136 is twice the size of transistor 154. The gates of transistors 136 and 154 are coupled together, and the sources of transistors 136 and 154 are also coupled together at ground 124. Therefore, the gate-to-source voltages $V_{GS}$ of transistors 136 and 154 are the same. Because transistor 136 is approximately twice the size of transistor 154, transistor 136 conducts approximately twice as much current as transistor 154. The current through transistor 136 is current $I_3$ 148, so the current through transistor 154 is $I_3/2$, shown in FIG. 1 as current 158. In an example, transistors 136 and 154 operate as a second current mirror in voltage supervisor 100, with the current being scaled responsive to the transistors 136 and 154 being different sizes.

At the top of the fourth branch, the current flowing through transistor 150 is k times the current $I_1$ 126 (e.g., $kI_1$). The current $kI_1$ is independent of supply voltage $V_{IN}$, because current $I_1$ 126 is independent of supply voltage $V_{IN}$, as described above with respect to Equation 1. Thus, the current $kI_1$ is approximately constant through time as supply voltage $V_{IN}$ rises. As supply voltage $V_{IN}$ rises, however, the current 158 (e.g., $I_3/2$) at the bottom of the fourth branch will also rise, because current $I_3$ 148 is the combination of currents I 129 (approximately equal to $I_1$ 126) and $I_2$ 146, and current $I_2$ 146 is dependent on $V_{IN}$. Responsive to current 158 rising above the current $kI_1$ in the fourth branch, TRIP node 156 switches state. Specifically, responsive to supply voltage $V_{IN}$ being below the voltage threshold being monitored, the current $kI_1$ pulls TRIP node 156 up to a high voltage. As supply voltage $V_{IN}$ increases enough for current 158 to rise above the current $kI_1$ (which is possible because current 158 varies with supply voltage $V_{IN}$ and current $kI_1$ does not), TRIP node 156 is pulled to a low voltage. The voltage at TRIP node 156 that causes the node to flip is the trip voltage (e.g., the threshold voltage or voltage threshold).

The currents $kI_1$ and 158 can be calculated, and the trip voltage can also be calculated. The current through transistor 150, $kI_1$, is shown in Equation (4):

$$kI_1 = k\frac{\Delta V_{GS}}{R_{BOT}} \tag{4}$$

The current 158 is one-half of current $I_3$ 148, which is calculated in Equation (5)

$$I_{158} = \frac{1}{2}\left[\frac{V_{IN} - \Delta V_{GS}}{R_{TOP}} + \frac{\Delta V_{GS}}{R_{BOT}}\right] \tag{5}$$

TRIP node 156 begins to flip as the current 158 equals the current $kI_1$. The trip voltage is shown in Equation (6):

$$V_{TRIP} = \left[1 + (2k-1)\frac{R_{TOP}}{R_{BOT}}\right]\Delta V_{GS} \tag{6}$$

Equation (6) shows that the trip voltage $V_{TRIP}$ is directly proportional to $\Delta V_{GS}$ multiplied by a constant. The constant is a function of resistor 144 ($R_{TOP}$) and resistor 122 ($R_{BOT}$). The values of these two resistors 122 and 144 may deviate from their design values based on process variations when voltage supervisor 100 is manufactured. However, if they vary in the same manner, the process variations may cancel out according to Equation (6). The constant k is the relative device size, which is constant and will not substantially vary with process or temperature. The major variation in trip voltage $V_{TRIP}$ is the process variation that affects $\Delta V_{GS}$. In an example, the transistors herein can be sized so the temperature coefficient of $\Delta V_{GS}$ is approximately zero. In that case, trip voltage $V_{TRIP}$ will also not vary noticeably with temperature.

As described above, voltage supervisor 100 is programmable for a variety of voltage thresholds. The values of resistors 122 and 144 can be adjusted to vary the trip voltage $V_{TRIP}$. The value of k (the relative device size) can also be adjusted to vary the trip voltage $V_{TRIP}$. Therefore, trip voltage Vii can be finely tuned in examples herein. The topology of voltage supervisor 100 provides for this programmability, which means the same circuit is useful to provide a different trip voltage $V_{TRIP}$. Variable resistors could be used in some examples to vary the trip voltage $V_{TRIP}$. In other examples, resistance could be switched in or out to vary the resistance and adjust the trip voltage $V_{TRIP}$.

Another feature of voltage supervisor 100 in examples is that after the trip point has been reached, current $I_2$ 146 is limited. Current $I_1$ 126 is independent of supply voltage, but current $I_2$ 146 is not. Current clamp 106 is useful to limit current $I_2$ 146 as supply voltage $V_{IN}$ rises. Current clamp 106 prevents current $I_2$ 146 from increasing after a certain value of supply voltage $V_{IN}$ is reached. At that certain value of supply voltage $V_{IN}$, there is enough voltage margin between voltage supply $V_{IN}$ and ground 124 for transistor 142 to supply current equal to approximately two times current $I_1$ 126. Transistor 142 saturates if the current flowing through it reaches two times current $I_1$ 126. Therefore, if supply voltage $V_{IN}$ increases beyond that certain value, no additional current flows through that branch of voltage supervisor 100.

After the voltage supervisor 100 is fabricated, trip voltage $V_{TRIP}$ cannot be changed unless variable resistances are used. Therefore, to prevent changes with temperature, transistors 116 and 120 should be sized so the temperature coefficient of $\Delta V_{GS}$ is approximately zero. If the temperature coefficient of $\Delta V_{GS}$ between transistors 116 and 120 is approximately zero, then the value of current $I_1$ 126 will also be more resistant to temperature changes, which allows for current $I_1$ 126 to be useful as a reference current.

Two methods are described herein to achieve a temperature coefficient near zero: one method involves using transistors in a strong inversion operation, and another method involves using transistors in a weak inversion operation. In a strong inversion operation, the $V_{GS}$ of a Transistor is significantly above the threshold voltage $V_{TH}$. The overdrive voltage $V_{OV}$ is the gate-to-source voltage $V_{GS}$ in excess of the threshold voltage $V_{TH}$. In a weak inversion operation (e.g., the subthreshold region), the transistor operates with a gate-to-source voltage $V_{GS}$ below the threshold voltage $V_{TH}$.

First, in the example of strong inversion operation, $V_{GS}=V_{TH}+V_{OV}$. Also, Equation (7) shows the differences in these voltages:

$$\Delta V_{GS}=\Delta V_{TH}+\Delta V_{OV} \tag{7}$$

$\Delta V_{GS}$ is the difference in the gate-to-source voltages between transistors 116 and 120 as described above with respect to FIG. 1. In an example, transistor 116 is a low voltage transistor (LVT) and the variables relating to transistor 116 in the equations below will have the subscript LVT. In the example, transistor 120 is a native transistor (NAT) and the variables relating to transistor 120 in the equations below will have the subscript NAT. The variables in Equation (7) can be expanded based on the region of operation the transistor is operating in. For strong inversion operation, $\Delta V_{OV}$ equals the $V_{OV}$ of transistor 116 minus the $V_{OV}$ of transistor 120. Substituting these terms for $\Delta V_{OV}$ results in Equation (8):

$$\Delta V_{GS}=\Delta V_{TH}[V_{OV(LVT)}-V_{OV(NAT)}] \tag{8}$$

Current $I_1$ 126 in FIG. 1 is defined in Equation (9):

$$I_1 = \frac{k'}{2}\frac{W}{L}V_{OV}^2 \tag{9}$$

where k' is the process transconductance parameter, which is a constant that depends on the process technology used to fabricate an integrated circuit; and W/L is the ratio of channel width to channel length (for transistor 120 in this example, although Equation 9 is used to find the current through other transistors as well). Solving Equation (9) for $V_{OV}$ and substituting that solution $V_{OV}$ for both $V_{OV(LVT)}$ and $V_{OV(NAT)}$ produces Equation (10):

$$\Delta V_{GS} = \Delta V_{TH} + \left[\sqrt{\frac{2I_1}{k'_{LVT}\left(\frac{W}{L}\right)_{LVT}}} - \sqrt{\frac{2I_1}{k'_{NAT}\left(\frac{W}{L}\right)_{NAT}}}\right] \tag{10}$$

$\Delta V_{TH}$ is a positive value, and is equal to the threshold voltage $V_{TH}$ of transistor 116 minus the threshold voltage $V_{TH}$ of transistor 120. In an example, threshold voltage $V_{TH}$ of transistor 116 is greater than zero, and threshold voltage $V_{TH}$ of transistor 120 is approximately zero or slightly less than zero. Therefore, $\Delta V_{TH}$ is greater than zero.

Equation (11) is a rearrangement of Equation (10):

$$\Delta V_{GS} = \Delta V_{TH} + \sqrt{\frac{2I_1}{W/L}}\left[\frac{1}{\sqrt{k'_{LVT}}} - \frac{1}{\sqrt{k'_{NAT}}}\right] \tag{11}$$

In this example, the LVT and NAT transistors are identically sized, so the W/L variable is the same for each transistor and can be moved outside of the bracket as shown in Equation (11). The next step is to identify the temperature coefficient of $\Delta V_{TH}$ and the temperature coefficient of the term that is added to $\Delta V_{TH}$ in Equation (11). To achieve a zero temperature coefficient, the temperature coefficient of $\Delta V_{TH}$ should be canceled by the temperature coefficient of the other term in Equation (11) (which is equivalent to $\Delta V_{OV}$, as shown in Equation (7)).

$\Delta V_{TH}$ is process dependent, so it cannot be adjusted to achieve a zero temperature coefficient. For the $\Delta V_{OV}$ term, the size of the transistors can be modified (by modifying the W and L terms). The W and L variables can be adjusted to vary the temperature coefficient of the $\Delta V_{OV}$ term in the appropriate direction so as to cancel the temperature coefficient of $\Delta V_{TH}$. For example, if the temperature coefficient of $\Delta V_{TH}$ is $\Theta$, the other term should be $-\Theta$ so the terms cancel. Also, k' is equal to the mobility ($\mu$) of a device times the oxide capacitance Cox (k'=$\mu$Cox).

Figure 2:
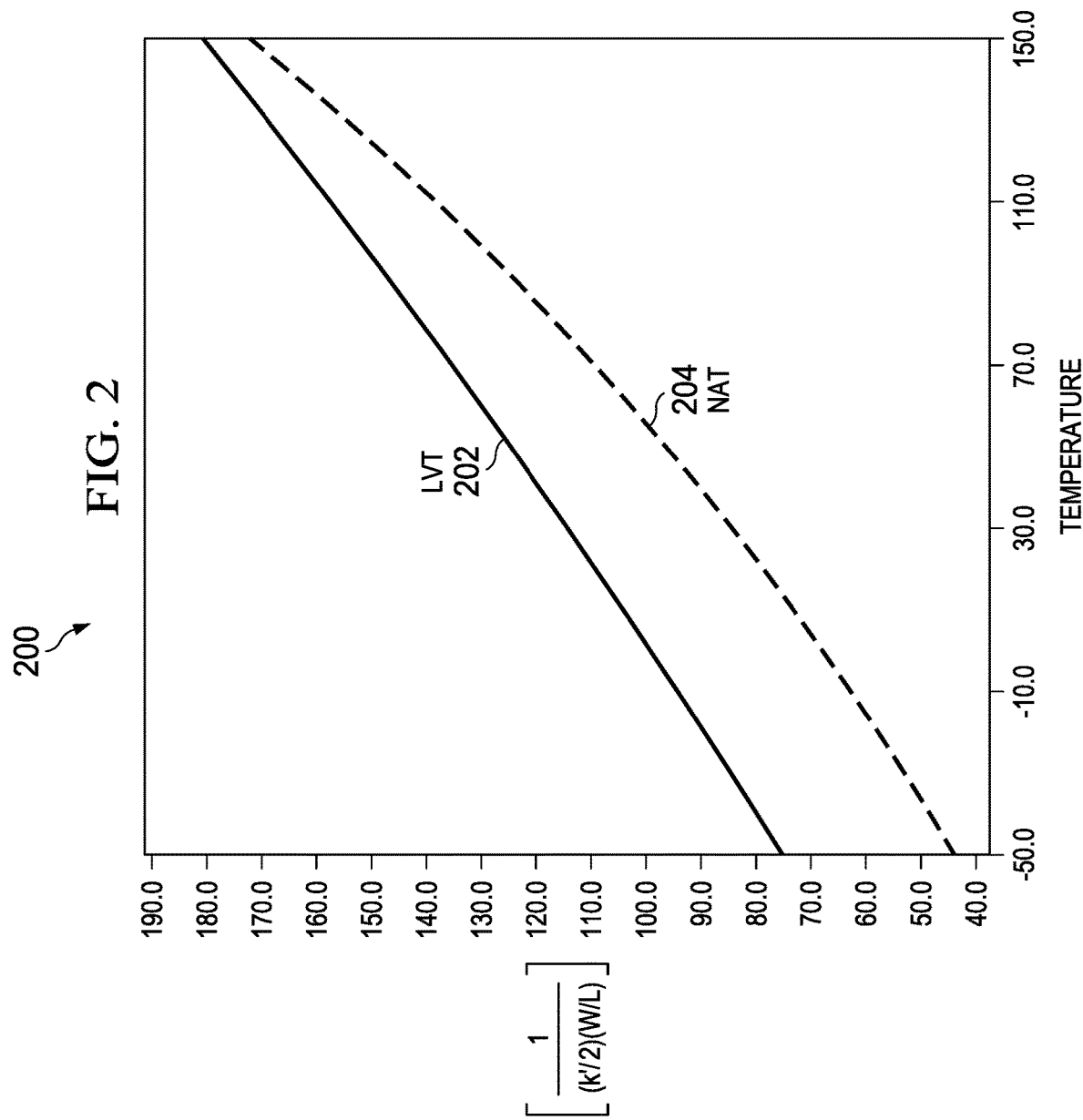
FIG. 2 is a graph of temperature coefficients for strong inversion operation in accordance with various examples.

FIG. 2 is a graph 200 of temperature coefficients for strong inversion operation according to an example. Graph 200 graphs the reciprocal of (k'/2)(W/L) versus temperature. The reciprocal of (k'/2)(W/L) is graphed on the y-axis. The x-axis is temperature, in Celsius. Curve 202 is the reciprocal of (k'/2)(W/L) for an LVT device such as transistor 116. Curve 204 is the reciprocal of the term (k'/2)(W/L) for a NAT device such as transistor 120. As seen in graph 200, the reciprocal of this term for LVT (curve 202) has a lower slope than the reciprocal of this term for NAT (curve 204). If these two terms are subtracted (which is done in the last part of Equation (11)), the result is a negative temperature coefficient. Therefore, the second term on the right side of Equation (11), $$\sqrt{\frac{2I_1}{W/L}}\left[\frac{1}{\sqrt{k'_{LVT}}} - \frac{1}{\sqrt{k'_{NAT}}}\right]$$

(the radical multiplied by the term in the brackets), which is added to $\Delta V_{TH}$, falls with rising temperature. This means the second term as shown above has a negative temperature coefficient. That second term can be adjusted by altering the W and L values (of the identically sized LVT and NAT transistors) until its absolute value equals the absolute value of $\Delta V_{TH}$. If those absolute values are equal, the second term cancels $\Delta V_{TH}$ and the resulting temperature coefficient is approximately zero.

For the second case of subthreshold or weak inversion operation, $\Delta V_{GS}=\Delta V_{TH}+\Delta V_{OV}$. Similar mathematical substitutions as described above are performed for this type of operation. However, for subthreshold operation the $\Delta V_{OV}$ term is different than for the strong inversion operation. In an example, subthreshold operation is characterized by Equation (12):

$$\Delta V_{GS} = \Delta V_{TH} + nV_T ln\left(\frac{k\prime_{NAT}\left(\frac{W}{L}\right)_{NAT}}{k\prime_{LVT}\left(\frac{W}{L}\right)_{LVT}}\right) \quad (12)$$

The logarithmic term in Equation (12) (which is equivalent to $\Delta V_{OV}$) is adjusted, like with the strong inversion operation above, in order to cancel out the temperature coefficient term of $\Delta V_{TH}$. The logarithmic term can be adjusted by adjusting the W and L variables for either or both of the LVT and NAT transistors.

Figure 3:
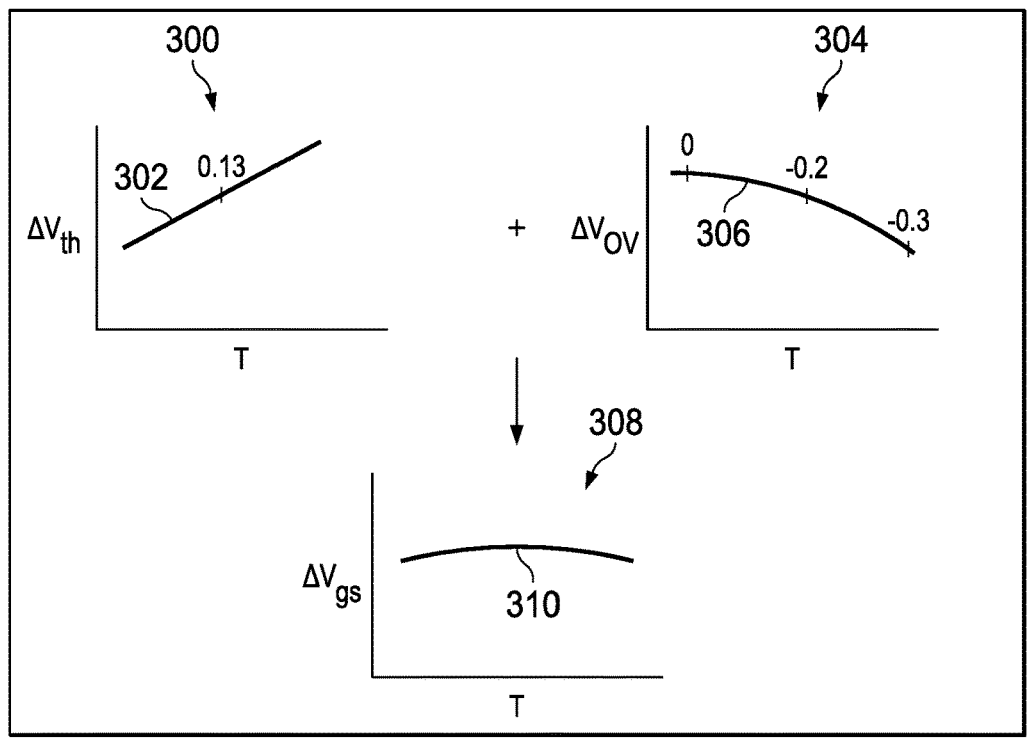
FIG. 3 is a collection of graphs that show how zero temperature coefficient is achieved in accordance with various examples.

FIG. 3 is a collection of graphs that shows the cancellation of the temperature coefficients in the subthreshold operation. Graph 300 is a graph of $\Delta V_{TH}$ (in Volts) versus temperature (in Celsius). The temperature coefficient is shown as curve 302. Curve 302 has a positive slope of approximately 0.13 as indicated in graph 300.

Graph 304 is a graph of $\Delta V_{OV}$ with respect to temperature. The temperature coefficient is shown as curve 306. Curve 306 has a negative slope, with a slope of approximately zero on the left edge of curve 306, a slope of approximately –0.2 in the middle of curve 306, and a slope of approximately –0.3 on the right edge of curve 306.

In an example, if the slope of $\Delta V_{OV}$ is made as equally negative as the $\Delta V_{TH}$ slope is positive, the result is an umbrella-shaped curve like curve 310 shown in the graph 308. Graph 308 is the graph of $\Delta V_{GS}$ with respect to temperature, and is a result of combining curves 302 and 306. On curve 310, the initial (far left) and final (far right) points are at a similar $V_{GS}$ value. Therefore, with an increase in temperature, curve 310 does not exhibit a gradient increase or a gradient decrease; instead, the result is the umbrella-shaped curve. Curve 310 is not perfectly horizontal, so there is some effect caused by a change in temperature, but it is close to horizontal, so the effect is small in some examples.

Figure 4:
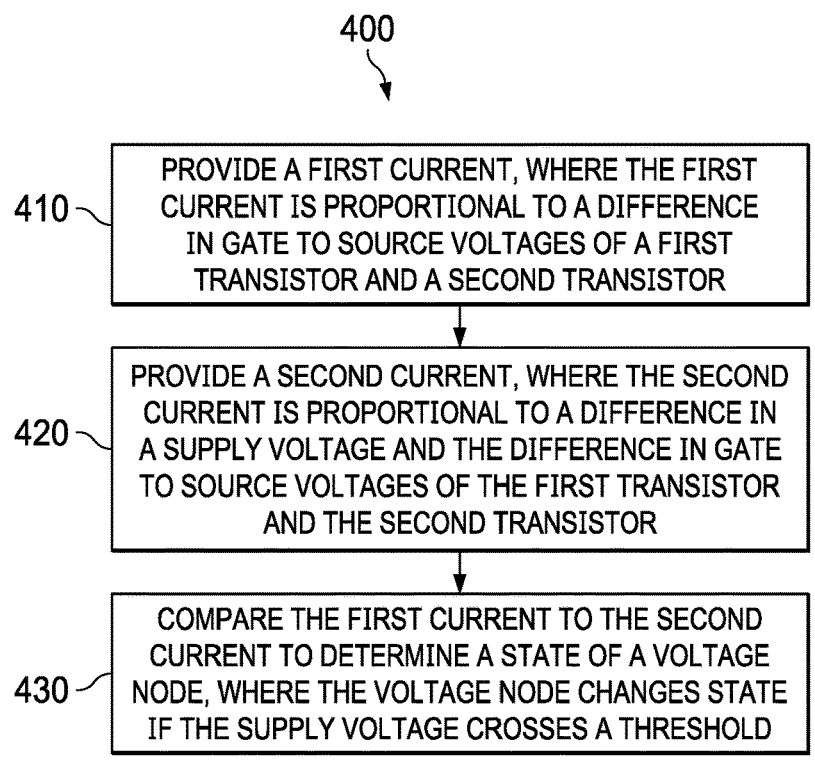
FIG. 4 is a flowchart of a method for voltage supervision in accordance with various examples.

FIG. 4 is a flowchart of a method 400 for voltage supervision in accordance with various examples herein. Although the method 400 is described in conjunction with FIGS. 1-3, any system configured to perform the method, in any suitable order, falls within the scope of this description. In one example, the components in FIG. 1 perform the method 400.

Method 400 begins at step 410, where the voltage supervisor 100 provides a first current, where the first current is proportional to a difference in gate-to-source voltages $V_{GS}$ of a first transistor and a second transistor. In an example, the current mirror of transistors 114 and 118 provide the first current $I_1$ 126. The first current $I_1$ 126 is proportional to the difference in the $V_{GS}$ of transistors 116 and 120. Transistor 116 is the first transistor and transistor 120 is the second transistor in an example.

Method 400 continues at step 420, where the voltage supervisor 100 provides a second current, where the second current is proportional to a difference in a supply voltage and the difference in gate-to-source voltages $V_{GS}$ of the first transistor and the second transistor. In an example, the second current is current $I_2$ 146 as described above in Equation (2). Equation (2) shows that current $I_2$ 146 is proportional to $V_{IN}$–$\Delta V_{GS}$. In one example, transistors 116 and 120 are first and second transistors, respectively, while transistor 142 is a third transistor that provides the second current.

Method 400 continues at step 430, where the voltage supervisor 100 compares the first current to the second current to determine a state of a voltage node, where the voltage node changes state if the supply voltage crosses a threshold. As described above with respect to FIG. 1, if the current 158 rises above the current $kI_1$ due to an increase in supply voltage $V_{IN}$, the TRIP node 156 changes state. In one example, transistor 150 is a fourth transistor and transistor 152 is a fifth transistor that conduct the current $kI_1$. Transistor 154 is a sixth transistor that conducts the current 158, as part of a second current mirror with transistor 136. In other examples, any suitable method is useful for comparing the first current to the second current.

Examples described herein can be used in a vast number of applications. Any end equipment system that benefits from accurate voltage supervision circuitry can benefit from the examples herein, due to the scalable and compact design of voltage supervisor 100. Voltage supervisor 100 functions independently of the region of operation of the transistors. That is, in one example, voltage supervisor 100 can use reduced area by using transistors in strong inversion. In another example, transistors are useful in subthreshold operation for low $I_Q$ operation.

In voltage supervisor 100, the constant that determines the directly proportional relationship between the trip point and $\Delta V_{GS}$ is scalable as well as process independent. The constant can be scaled in two ways (current mirror ratio and resistor ratio). Scaling in two ways allows the trip point to be programmed in a fine manner, without a large increase in silicon area.

In voltage supervisor 100, $I_Q$ for the described topology is independent of increasing $V_{IN}$ after the trip point has been reached. This independence is achieved by use of current clamp 106 in the branch of voltage supervisor 100 that carries the current $I_2$ 146, which is dependent on $V_{IN}$.

In some examples, voltage supervisor 100 works with a range of approximately 1.0 volts to approximately 5.0 volts. Also, voltage supervisor 100 is self-starting due to start-up section 102. Response time is fast for voltage supervisor 100 compared to conventional systems.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A voltage supervisor comprising:
    a first transistor coupled between a first supply voltage and a second supply voltage;
    a second transistor coupled between the first supply voltage and the second supply voltage;
    and the voltage supervisor configured to:
        provide a first current proportional to a difference in gate-to-source voltages of the first transistor and the second transistor;
        provide a second current proportional to a difference in the first supply voltage and the difference in gate-to-source voltages of the first transistor and the second transistor;
        compare the first current to the second current to determine a voltage value that changes a state responsive to the first supply voltage crossing a threshold; and
        clamp the second current responsive to the first supply voltage crossing the threshold.

2. The voltage supervisor of claim 1, wherein the second current is larger than the first current responsive to the first supply voltage crossing the threshold.

3. The voltage supervisor of claim 1, wherein the first transistor and the second transistor are sized to reduce a temperature coefficient of the difference in gate-to-source voltages of the first transistor and the second transistor.

4. The voltage supervisor of claim 1, wherein a gate of the first transistor is coupled to a gate of the second transistor.

5. The voltage supervisor of claim 1, wherein a drain of the second transistor is coupled to a current mirror, and a source of the second transistor is coupled to a resistor.

6. The voltage supervisor of claim 1, wherein the voltage supervisor includes a third transistor coupled to the first supply voltage and to a resistor, the third transistor configured to provide the second current.

7. The voltage supervisor of claim 6, wherein the third transistor is configured to clamp the second current responsive to the first supply voltage crossing the threshold.

8. The voltage supervisor of claim 1, wherein the voltage supervisor is configured to provide the first current using a current mirror.

9. The voltage supervisor of claim 1, wherein the voltage supervisor includes first and second resistors, the first resistor coupled to the second transistor, the first and second resistors sized to determine the threshold.

10. A voltage supervisor, comprising:
    a reference current generator having a current mirror, the current mirror configured to provide a first current that is proportional to a difference in gate-to-source voltages of a first transistor and a second transistor;
    a third transistor having a gate coupled to the current mirror, a source adapted to be coupled to a power supply, and a drain coupled to a first terminal of a resistor, the third transistor is configured to provide a second current proportional to a difference in a supply voltage and the difference in gate-to-source voltages of the first transistor and the second transistor; and
    a fourth transistor having a gate coupled to the gate of the third transistor, a source adapted to be coupled to the power supply, and a drain having a drain voltage indicative of the supply voltage above a threshold; wherein:
    the resistor includes a second terminal coupled to a source of a fifth transistor, wherein a gate of the fifth transistor is coupled to a gate of the first transistor and a gate of the second transistor.

11. The voltage supervisor of claim 10, wherein the third transistor is configured to clamp the second current responsive to the supply voltage crossing the threshold.

12. The voltage supervisor of claim 10, wherein the resistor is a first resistor, and wherein the threshold is based at least in part on a value of the first resistor and a value of a second resistor coupled to a source of the second transistor.

13. The voltage supervisor of claim 10, wherein the first transistor and the second transistor are sized to reduce a temperature coefficient of the difference in gate-to-source voltages of the first transistor and the second transistor.

* * * * *